United States Patent
Zhu et al.

(10) Patent No.: US 9,991,854 B1
(45) Date of Patent: Jun. 5, 2018

(54) POWER AMPLIFIER OUTPUT CIRCUIT ARRANGEMENTS WITH MUTUAL COUPLING BETWEEN INDUCTORS

(71) Applicant: NXP USA, Inc., Austin, TX (US)

(72) Inventors: Ning Zhu, Chandler, AZ (US); Damon G. Holmes, Scottsdale, AZ (US); Ricardo Uscola, Tempe, AZ (US); Jeffrey Kevin Jones, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days. days.

(21) Appl. No.: 15/449,297

(22) Filed: Mar. 3, 2017

(51) Int. Cl.
*H03F 3/191* (2006.01)
*H03F 1/56* (2006.01)
*H03F 3/195* (2006.01)
*H03F 3/213* (2006.01)
*H01L 23/66* (2006.01)

(52) U.S. Cl.
CPC ............ *H03F 1/565* (2013.01); *H01L 23/66* (2013.01); *H03F 3/195* (2013.01); *H03F 3/213* (2013.01); *H01L 2223/6611* (2013.01); *H01L 2223/6655* (2013.01); *H03F 2200/222* (2013.01); *H03F 2200/387* (2013.01); *H03F 2200/451* (2013.01); *H03F 2200/552* (2013.01)

(58) Field of Classification Search
CPC ....................................................... H03F 3/191
USPC ................................................ 330/302, 305
See application file for complete search history.

(56) References Cited

U.S. PATENT DOCUMENTS

| | | | | |
|---|---|---|---|---|
| 5,406,226 A | * | 4/1995 | Cioffi | .................. H03F 1/34 330/286 |
| 8,659,359 B2 | * | 2/2014 | Ladhani | ................ H03F 1/0288 330/302 |
| 8,803,613 B2 | * | 8/2014 | Mochizuki | .............. H03F 1/565 330/277 |
| 9,281,283 B2 | | 3/2016 | Viswanathan et al. | |
| 9,571,044 B1 | * | 2/2017 | Zhu | ......................... H03F 1/565 |
| 2011/0175680 A1 | * | 7/2011 | Bouisse | ................. H03F 1/086 330/295 |
| 2015/0381121 A1 | | 12/2015 | Jones et al. | |
| 2016/0344353 A1 | | 11/2016 | Watts et al. | |

* cited by examiner

*Primary Examiner* — Henry Choe

(57) ABSTRACT

Embodiments of an RF amplifier include a transistor with a control terminal and first and second current carrying terminals, and a shunt circuit coupled between the first current carrying terminal and a ground reference node. The shunt circuit includes a first shunt inductive element, a second shunt inductance, and a shunt capacitor coupled in series. Instead of a separate inductive element, the second shunt inductance may be achieved via magnetic coupling of the first shunt inductive element and an envelope inductive element of a video bandwidth circuit that is coupled between an RF cold point node (between the first and second shunt inductances) and the ground. Alternatively, an envelope inductance in the video bandwidth circuit may be achieved via magnetic coupling of first and second shunt inductive elements. A better RF cold point may be achieved without physically incorporating separate inductive elements, allowing for reduction in cost and size.

20 Claims, 9 Drawing Sheets

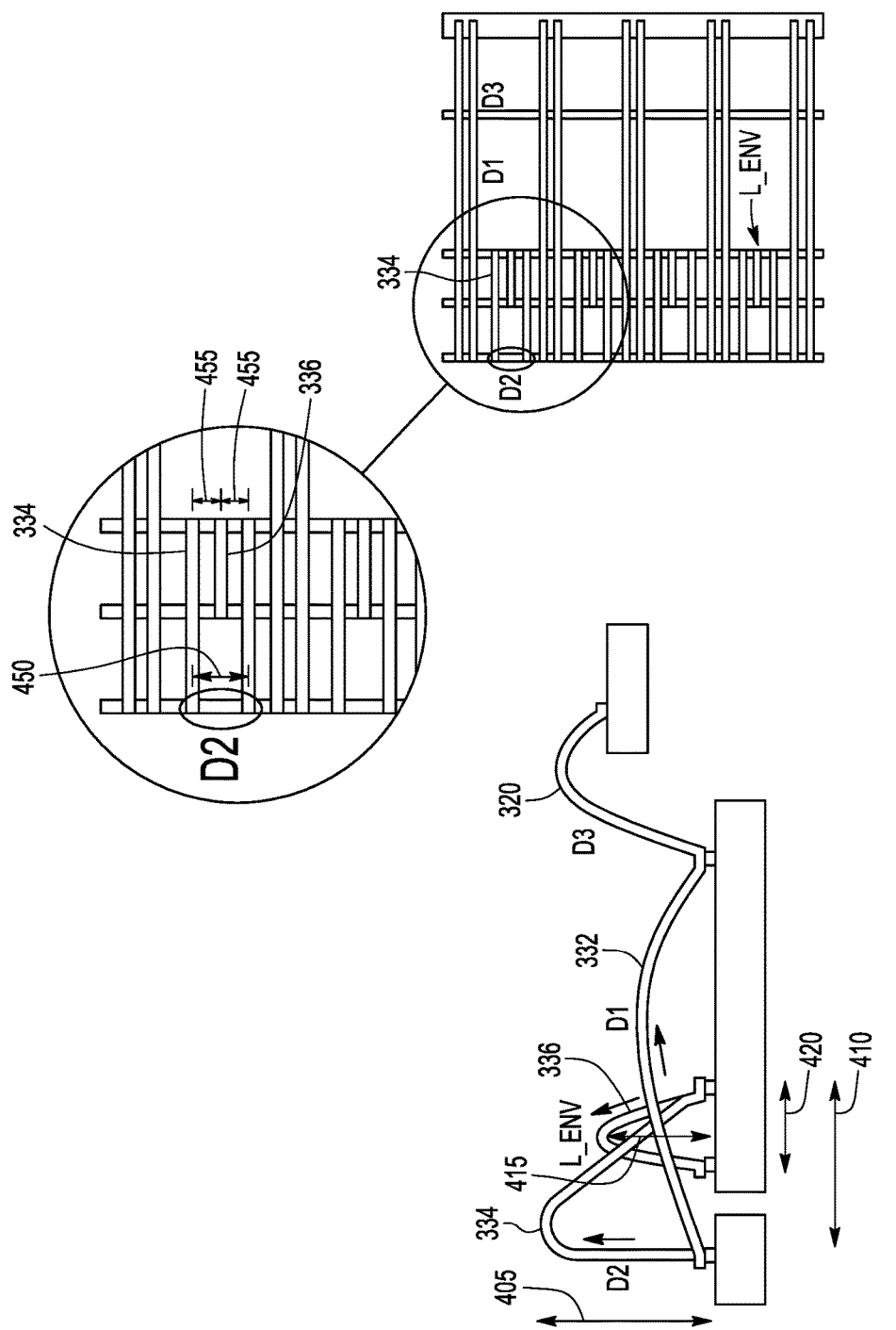

POWER AMPLIFIER OUTPUT CIRCUIT ARRANGEMENTS WITH MUTUAL COUPLING BETWEEN INDUCTORS

TECHNICAL FIELD

Embodiments of the subject matter described herein relate generally to packaged semiconductor devices, and more particularly to packaged, radio frequency (RF) semiconductor devices with impedance matching circuits that include inductances resulting from magnetic coupling of inductive elements to potentially enhance performance.

BACKGROUND

A typical high power, radio frequency (RF) semiconductor device may include one or more input leads, one or more output leads, one or more transistors, bondwires coupling the input lead(s) to the transistor(s), and bondwires coupling the transistor(s) to the output lead(s). The bondwires have significant inductive reactance at high frequencies, and such inductances are factored into the design of input and output impedance matching circuits for a device. In some cases, input and output impedance matching circuits may be contained within the same package that contains the device's transistor(s). More specifically, an in-package, input impedance matching circuit may be coupled between a device's input lead and a control terminal (e.g., the gate) of a transistor, and an in-package, output impedance matching circuit may be coupled between a current conducting terminal (e.g., the drain) of a transistor and a device's output lead.

Packaged RF semiconductor devices are available that have decent performance when used in relatively narrowband applications with relatively low instantaneous signal bandwidth (ISBW) (e.g., ISBW of 150 megahertz (MHz) or less). However, increased ISBW (e.g., ISBW of 200 MHz or more) is becoming a major requirement for RF communication amplifiers (e.g., RF communication infrastructure amplifiers). This requirement stems from the fact that larger information download rates per second are becoming a significant enablement feature. Thus, trends in the RF communication industry include development of packaged RF semiconductor devices with increasingly wideband operation and relatively high ISBW.

Designing RF amplifier devices with high ISBW is challenging. For example, the ISBW of a device may be directly affected by the low frequency resonance (LFR) caused by interaction between the device's bias feeds and output circuits that are electrically connected between a device's transistor(s) and its output lead(s). Performance enhancements may be achieved by adding a shunt inductor between an access point (node) and a shunt capacitor—as part of a high-pass matching circuit—such that the new shunt inductor and the shunt capacitor resonate in proximity to the center operating frequency of the RF power amplifier device. However, as semiconductor packages become smaller and/or incorporate more elements, space for additional components is limited. Moreover, adding components can have negative consequences, such as power loss and undesirable interactions between components.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 4A and 4B reproduce the embodiment illustrated in FIGS. 3A and 3B, respectively, with dimensions added.

DETAILED DESCRIPTION

Figure 1:
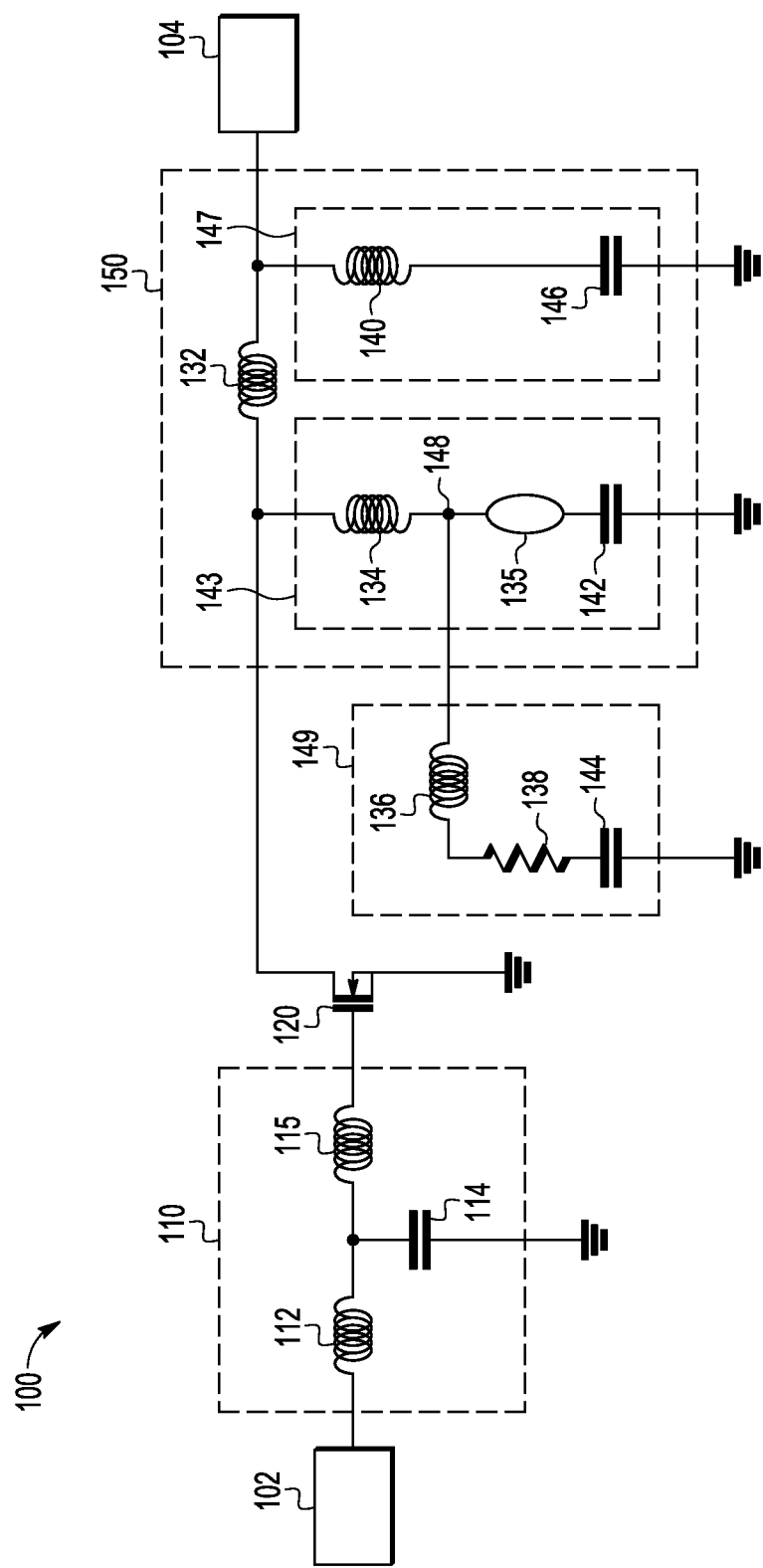
FIG. 1 is a schematic diagram of an RF amplifier with input and output impedance matching and envelope frequency termination circuits, in accordance with an example embodiment.

An output impedance matching circuit in a conventional RF power amplifier device may include, among other things, a shunt circuit that functions as a high-pass matching stage. For example, a conventional shunt circuit may include an inductor (herein "shunt inductor" or $L_{shunt}$) and a capacitor (herein "shunt capacitor" or $C_{shunt}$) coupled in series between a current conducting terminal (e.g., the drain) of the transistor and a ground reference node. In a conventional device, an "RF cold point" is located between the shunt inductor and the shunt capacitor. Essentially, the RF cold point is a node that may function as a virtual ground reference voltage for RF electrical signals. If the RF cold point were ideal, then during device operation, little or no RF energy at the power amplifier's center operating frequency would be present at the RF cold point. However, the RF cold point in a conventional shunt circuit is not ideal, and some RF energy at the center frequency is present at the RF cold point during operation.

To improve the low frequency resonance (LFR) of a device, and thus to increase the device's instantaneous signal bandwidth (ISBW), a device also may include an "envelope frequency termination circuit" (or "video bandwidth circuit") in the output impedance matching circuit. Essentially, a properly designed video bandwidth (VBW) circuit is configured to have low impedance at envelope frequencies, so that the envelope current may readily pass through the VBW circuit to ground, rather than being conveyed to the device's output lead. In a conventional device, the VBW circuit is electrically coupled to the RF cold point (i.e., to a node between the shunt inductance and capacitance) so that the VBW circuit is likely to be exposed only to a minimal amount of RF energy near the center operating frequency.

A typical VBW circuit may include a series combination of an inductance (herein "envelope inductor" or $L_{env}$), a resistance (herein "envelope resistor" or $R_{env}$), and a capacitance (herein "envelope capacitor" or $C_{env}$) coupled between the RF cold point and the ground reference node. In a conventional device, due to imperfection of the RF cold point, a reasonably significant amount of RF energy at the center operating frequency may be present at the RF cold point during operation, and that RF energy may convey into the VBW circuit and be dissipated by the envelope resistor. This undesirable power dissipation may manifest itself as a reduction in the drain efficiency of the device. Further, if the power dissipation becomes too high, it may compromise the integrity of the envelope resistor. In some devices, the envelope inductor value may be selected to present a high impedance to RF signals, thus deflecting RF signal from propagating through the VBW circuit. A relatively large envelope inductor may result in a reduction in the power dissipation in the envelope resistor, thus potentially increasing drain efficiency. However, such a relatively large envelope inductor also may increase the VBW circuit's baseband impedance and lower the LFR of the device. To achieve high linearization, the baseband impedance up to the LFR should be relatively low (e.g., 1.0 ohm or less). Conventional devices fail to achieve such a low baseband impedance up to the LFR.

Embodiments of the inventive subject matter include RF amplifiers and packaged semiconductor devices (e.g., packaged RF power transistor devices) that are configured to include a more ideal RF cold point than a conventional device. In other words, embodiments of RF amplifiers and devices include an RF cold point at which significantly less RF energy at the center operating frequency is present during operation, when compared with the RF energy that may be present at the RF cold point in a conventional RF amplifier or device. In addition, embodiments include a VBW circuit that is connected to such a "more ideal" RF cold point. With the RF cold point of the various embodiments, the VBW circuit design is not constrained to have to block significant amounts of RF energy near the center operating frequency, and thus may be designed with a relatively small envelope inductor while still achieving a relatively low baseband impedance (e.g., 1.0 ohm or less up to the LFR of the device). Without significant RF energy at the more ideal RF cold point, the device may avoid a drain efficiency performance penalty due to undesirable RF power dissipation in the envelope resistor. More specifically, with minimal RF energy present at the RF cold point, less power may be dissipated through the envelope resistor.

According to an embodiment, the RF cold point is improved by dividing the shunt inductance into two inductances. More specifically, a first shunt inductance is present between the transistor drain and a new RF cold point, and a second shunt inductance is coupled in series with the shunt capacitance between the new RF cold point and the ground reference node. According to an embodiment, the second shunt inductance and the shunt capacitance form a series resonant circuit in proximity to the center operating frequency of the RF power amplifier device, so that RF current near the center operating frequency that may be present at the new RF cold point will flow to ground through the shunt circuit, rather than flowing through the VBW circuit. With less RF energy present at the new RF cold point, the VBW circuit may be designed with a relatively low envelope inductance, and thus reduced baseband impedance up to the LFR. Further, less RF current flowing through the envelope resistor may translate into improved drain efficiency and a reduced potential for compromising the envelope resistor due to excessive power dissipation.

FIG. 1 is a schematic diagram of an RF power amplifier device 100. Device 100 includes an input lead 102, an input impedance matching circuit 110, a transistor 120, a video bandwidth (VBW) circuit 149, an output impedance matching circuit 150, and an output lead 104, in an embodiment. The VBW circuit 149 and the output impedance matching circuit 150 may be referred to collectively as an "output circuit." Although transistor 120 and various elements of the input and output impedance matching circuits 110, 150 and the VBW circuit 149 are shown as singular components, the depiction is for the purpose of ease of explanation only. Those of skill in the art would understand, based on the description herein, that transistor 120 and/or certain elements of the input and output impedance matching circuits 110, 150 and the VBW circuit 149 each may be implemented as multiple components (e.g., connected in parallel or in series with each other). For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 120 and various elements of the input and output impedance matching circuits 110, 150 and the VBW circuit 149, below, thus are not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically positioned to span between the exterior and the interior of the device's package. Input impedance matching circuit 110 is electrically coupled between the input lead 102 and a first terminal of transistor 120 (e.g., the gate), which is also located within the device's interior. Similarly, output impedance matching circuit 150 and VBW circuit 149 are electrically coupled between a second terminal of transistor 120 (e.g., the drain) and the output lead 104.

According to an embodiment, transistor 120 is the primary active component of device 100. Transistor 120 includes a control terminal and two current conducting terminals, where the current conducting terminals are spatially and electrically separated by a variable-conductivity channel. For example, transistor 120 may be a field effect transistor (FET) (such as a metal oxide semiconductor FET (MOSFET)), which includes a gate (control terminal), a drain (a first current conducting terminal), and a source (a second current conducting terminal). Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 120 is coupled to the input impedance matching circuit 110, the drain of transistor 120 is coupled to the output impedance matching circuit 150 and the VBW circuit 149, and the source of transistor 120 is coupled to ground (or another voltage reference). Through the variation of control signals provided to the gate of transistor 120, the current between the current conducting terminals of transistor 120 may be modulated.

Input impedance matching circuit 110 is coupled between the input lead 102 and the control terminal (e.g., gate) of the transistor 120. Input impedance matching circuit 110 is configured to raise the impedance of device 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface).

According to an embodiment, input impedance matching circuit 110 includes two inductive elements 112, 115 (e.g., two sets of bondwires) and a shunt capacitor 114. A first inductive element 112 (e.g., a first set of bondwires) is coupled between input lead 102 and a first terminal of capacitor 114, and a second inductive element 115 (e.g., a second set of bondwires) is coupled between the first terminal of capacitor 114 and the control terminal of transistor 120. The second terminal of capacitor 114 is coupled to ground (or another voltage reference). The combination of inductive elements 112, 115 and shunt capacitor 114 functions as a low-pass filter. According to an embodiment, the series combination of inductive elements 112, 115 may have a value in a range between about 50 picohenries (pH) to about 3 nanohenries (nH), and shunt capacitor 114 may have a value in a range between about 5 picofarads (pF) to about 80 pF.

Output impedance matching circuit 150 is coupled between the first current conducting terminal (e.g., drain) of transistor 120 and the output lead 104. Output impedance matching circuit 150 is configured to match the output impedance of device 100 with the input impedance of an external circuit or component (not shown) that may be coupled to output lead 104. According to an embodiment, output impedance matching circuit 150 includes four inductances 132, 134, 135, 140 and two capacitors 142, 146. A first inductive element 132 (e.g., a third set of bondwires), which may be referred to herein as a "series inductor" or $L_{series}$, is coupled between the first current conducting terminal (e.g., drain) of transistor 120 and the output lead 104. A second inductive element 134 (e.g., a fourth set of bondwires, an integrated inductor, or another inductive structure), which may be referred to herein as a "first shunt inductor" or $L_{shunt1}$, is coupled between the first current conducting terminal of transistor 120 and first node 148, which corresponds to an RF cold point node, in an embodiment. A third inductance 135 (further discussed below with respect to FIG. 2), which may be referred to herein as a "second shunt inductance" or $L_{shunt2}$, is coupled between the RF cold point node 148 and a first terminal of a first capacitor 142, which may be referred to herein as a "shunt capacitor." Finally, a fourth inductive element 140 (e.g., a fifth or sixth set of bondwires), which may be referred to herein as a "low-pass matching inductor," is coupled between the output lead 104 and a first terminal of a second capacitor 146, which may be referred to herein as a "low-pass matching capacitor." Second terminals of the shunt and low-pass matching capacitors 142, 146 are coupled to ground (or to another voltage reference), in an embodiment.

The second and third shunt inductances 134, 135 and the shunt capacitor 142 are coupled in series between a current conducting terminal of transistor 120 and ground, and this combination of impedance matching elements functions as a first (high-pass) matching stage. Accordingly, the combination of shunt inductances 134, 135 and shunt capacitor 142 may be referred to herein as a high-pass matching circuit 143. According to an embodiment, the series combination of shunt inductances 134, 135 may have a value in a range between about 100 pH to about 3 nH, and shunt capacitor 142 may have a value in a range between about 50 pF to about 500 pF, although these components may have values outside of these ranges, as well.

VBW circuit 149 is coupled between the RF cold point 148 and ground (or another voltage reference). VBW circuit 149 functions to improve the LFR of device 100 caused by the interaction between the output impedance matching circuit 150 and the bias feeds (not shown) by presenting a low impedance at envelope frequencies and a high impedance at RF frequencies. VBW circuit 149 essentially is "invisible" from an RF matching standpoint, as it only effects the output impedance at envelope frequencies (i.e., VBW circuit 149 provides terminations for the envelope frequencies of device 100).

According to an embodiment, VBW circuit 149 includes an inductance 136, a resistor 138, and a capacitor 144 coupled in series. According to an embodiment, the inductance 136, $L_{env}$, may be implemented as a set of bondwires coupling RF cold point 148 to the envelope resistor 138, $R_{env}$. In such an embodiment, envelope inductance 136 may have a value in a range between about 5 pH to about 2000 pH. In another embodiment, the envelope inductance 136 may be accomplished without bondwire connections between the RF cold point 148 and the other components of the VBW circuit 149 (i.e., resistor 138 and capacitor 144). More particularly, other embodiments of RF amplifier devices also may incorporate the envelope inductance 136, the envelope resistor 138, and the envelope capacitor 144 into the aforementioned embodiments of IPD assemblies, or into the die that includes transistor 120. Within an IPD assembly (or within the transistor die), the VBW circuit 149 components may be coupled together and to ground (or another voltage reference) with connections having very low and tightly controlled inductance. Tight control of the envelope inductance 136 is achieved, according to various embodiments, by connecting the envelope resistor 138 and envelope capacitor 144 to the RF cold point 148 through photolithographically formed connections within the IPD assembly (e.g., conductive traces and vias), rather than through bondwires. The IPD assemblies of the various embodiments may substantially reduce and control the inductance value of envelope inductance 136, thus reducing the total inductance included in the VBW circuit 149. This may have the effect of improving both the LFR and ISBW of the device 100.

Low-pass matching inductor 140 and low-pass matching capacitor 146 are coupled in series between the output lead 104 and ground (or another voltage reference), and this combination of impedance matching elements functions as a second (low-pass) matching stage. Accordingly, the combination of low-pass matching inductor 140 and low-pass matching capacitor 146 may be referred to herein as a low-pass matching circuit 147. According to an embodiment, low-pass matching inductor 140 may have a value in a range between about 50 pH to about 1 nH, and low-pass matching capacitor 146 may have a value in a range between about 1 pF to about 50 pF, although these components may have values outside of these ranges, as well. According to an alternate embodiment, low pass matching circuit 147 may be excluded altogether from device 100.

Figure 2B:
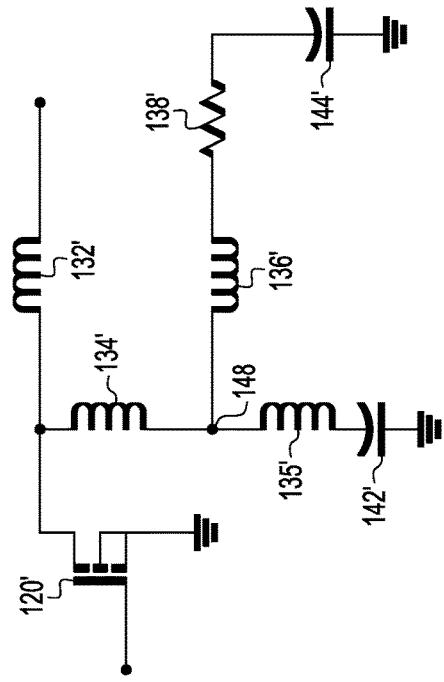
FIG. 2B is an equivalent circuit model of the circuit of FIG. 2A, with an indication of the magnetically-induced inductance.

Incorporating the inductance 135 in FIG. 1 is advantageous, but achieving the inductance 135 using an additional inductive element (such as a sixth set of bondwires or an integrated inductor) would increase space requirements where space is already limited, and would introduce losses associated with the addition of inductors in the circuit. FIG. 2A reproduces the transistor 120, the high-pass matching circuit 143, and the VBW circuit 149 of FIG. 1, but with no separate physical component to provide inductance 135. In other words, capacitor 142 is directly coupled to node 148 without an intervening physical inductor. Inductance 135 between node 148 and capacitor 142, however, may be electrically achieved in various embodiments by physically arranging the components of the output circuit to achieve mutual coupling between the second inductive element 134 (that is, the first shunt inductor, or $L_{shunt1}$) and the envelope inductance 136 (indicated with the double-sided arrow and mutual inductance "M"). FIG. 2B, which is an equivalent circuit model of the circuit of FIG. 2A, shows the corresponding circuit elements, but with a magnetically-induced inductance 135' corresponding with the inductance 135 in FIG. 1, where the inductance 135' is not a physical component, but instead is a result of the mutual coupling, with mutual inductance M, between inductances 134, 136 (FIG. 2A). According to an embodiment, the mutual inductance M has a value in a range between about 5 pH and about 500 pH to generate a series resonator with capacitor 142 (same as 142'), although the mutual inductance may be larger or smaller. The series resonator operates in proximity to the center operating frequency of the RF power amplifier device.

A good approximation of the resonant frequency, $F_R$, of the series resonant circuit that includes the mutual inductance M from 135' and shunt capacitor 142, C_shunt, is given by:

$$F_R = \frac{1}{2\pi\sqrt{(M * \text{C\_shunt})}}, \qquad \text{(Eqn. 1)}$$

In FIG. 2A, when the second inductive element 134 has a value of about 250 pH and the envelope inductance 136 has a value of about 110 pH, the inductances 134, 136 may be physically arranged so that the induced inductance 135' (due to mutual coupling M) may have a value of about 40 pH. For modeling equivalence with the circuit of FIG. 2A, the components in FIG. 2B may have, in this example, an equivalent second inductive element 134' having a value of about 210 pH (250 pH minus 40 pH), an equivalent envelope inductance 136' having a value of about 70 pH (110 pH minus 40 pH), and a magnetically-induced inductance 135' having a value of about 40 pH. It is noted that the equivalent circuit model of FIG. 2B is provided for illustration only, and a magnetically-induced inductance 135' does not represent a separate physical inductive element but rather an inductance from magnetic coupling of inductive elements 134' and 136' resulting from the physical arrangement of circuit components, examples of which are discussed here.

Figure 2D:
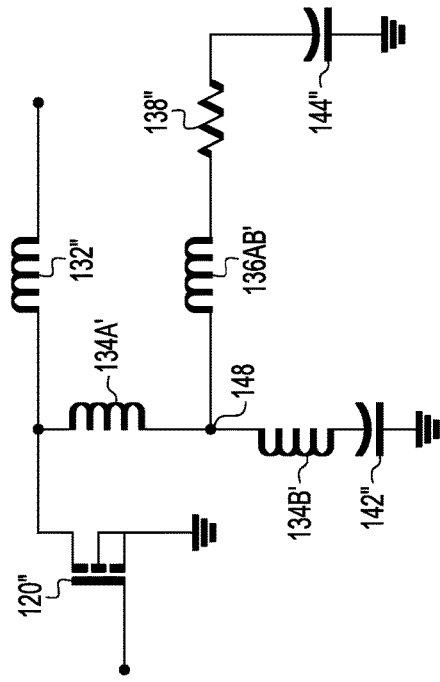
FIG. 2D is an equivalent circuit model of the circuit of FIG. 2C, with an indication of the magnetically-induced inductance.
Figure 2A:
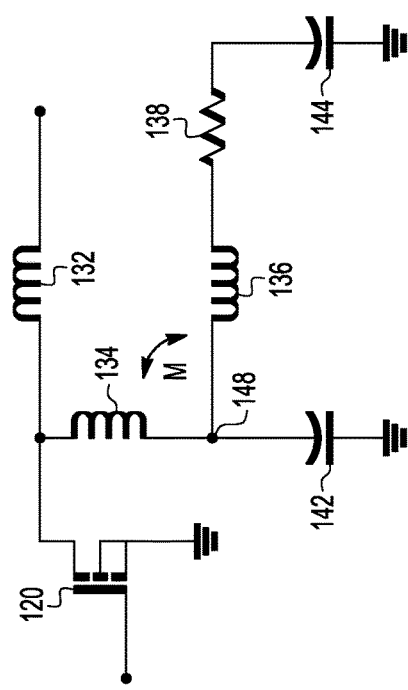
FIG. 2A is a representation of an exemplary embodiment, showing a portion of the circuit of FIG. 1, with an indication of a pair of inductive elements that can magnetically couple to achieve an inductance without the introduction of a separate inductive element.
Figure 2C:
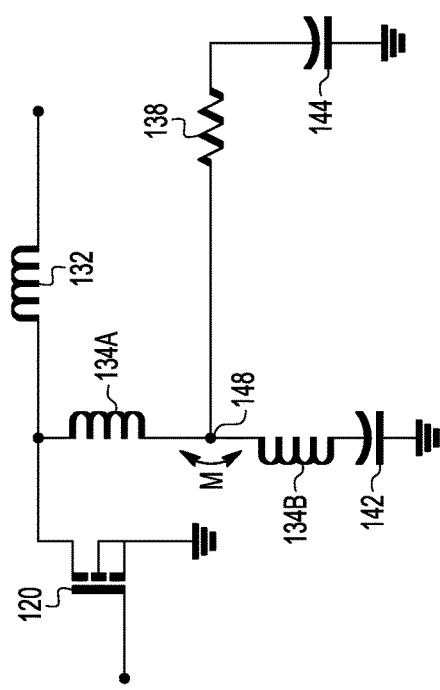
FIG. 2C is a representation of an alternative exemplary embodiment, showing a portion of the circuit of FIG. 1, reconfigured such that a different pair of inductive elements magnetically couple to achieve an inductance to replace one of the separate inductive elements of FIG. 1.

Referring to FIGS. 2C and 2D, in alternative configurations, mutual inductance between shunt inductive elements 134a, 134b can be used to obtain envelope inductance 136 without the use of a separate physical inductive element for envelope inductance 136, in similar fashion. In FIG. 2C, a first shunt inductive element 134a and a second shunt inductive element 134b can be coupled in series with node 148 between the two inductive elements 134a, 134b. The inductive elements 134a and 134b are physically arranged to achieve mutual coupling between the inductive elements 134a and 134b (indicated with the double-sided arrow and mutual inductance "M"). In the equivalent circuit model represented in FIG. 2D, shunt inductive elements 134a' and 134b' couple to provide magnetically-induced envelope inductance 136ab' between node 148 and the envelope resistor 138". According to an embodiment, the mutual inductance M has a value in a range between about 5 pH and about 500 pH, although the mutual inductance may be larger or smaller. A series resonator is generated by inductive element 134b' and capacitor 142 (similar to 142"), to operate in proximity to the center operating frequency of the RF power amplifier device.

A good approximation of the resonant frequency, $F_R$, of the series resonant circuit that includes the inductive element 134b', L_shunt_2-M, and shunt capacitor 142, C_shunt, is given by:

$$F_R = \frac{1}{2\pi\sqrt{((\text{L\_shunt\_2} - M) * \text{C\_shunt})}}, \qquad \text{(Eqn. 2)}$$

By way of example, when first shunt inductive element 134a has a value of about 280 pH, and second shunt inductive element 134b has a value of about 110 pH, the induced inductance 136ab' may have a value of about 70 pH. For modeling the equivalence with the circuit of FIG. 2C, the components in FIG. 2D may have, in this example, equivalent second shunt inductive elements 134a' and 134b' with inductance values of about 210 pH (280 pH minus 70 pH) and 40 pH (110 minus 70 pH), respectively, and a magnetically-induced envelope inductance 136ab' of about 70 pH. It is noted, as it was with respect to FIG. 2B, that the equivalent circuit model of FIG. 2D is provided for illustration only, and a magnetically-induced envelope inductance 136ab' does not represent a separate physical inductive element but rather an inductance resulting from magnetic coupling of inductive elements 134a' and 134b' resulting from the physical arrangement of circuit components.

Figure 3B:
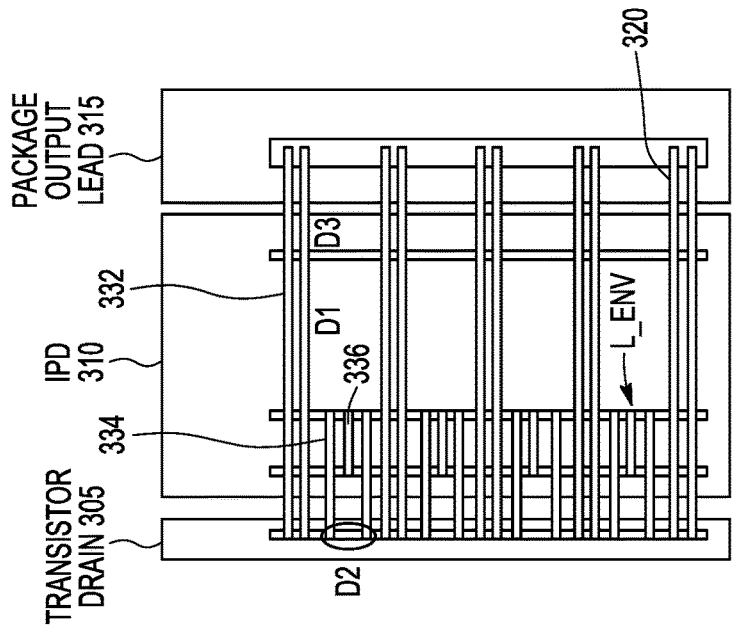
FIGS. 3A and 3B provide side and top views, respectively, of a bonding diagram for a portion of an exemplary semiconductor package with transistor die, integrated passive device (IPD) section, and package output lead sections.
Figure 3A:
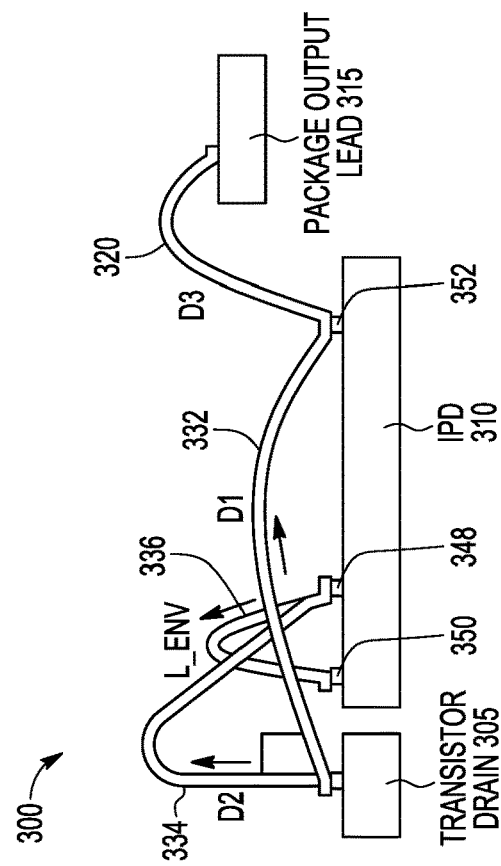

FIGS. 3A and 3B represent one embodiment of a portion of a semiconductor package capable of implementing the circuit of FIG. 2A, with a high-pass matching circuit that includes a magnetically-induced inductance in place of a separate, physical inductive element. Package 300 includes a transistor die (including a conductive transistor drain terminal 305 coupled to a drain of transistor 120 within the transistor die), an IPD 310, and a package output lead 315, all coupled to a common substrate (e.g., a conductive flange, not shown). A first shunt inductive element 334, shown as a set of bondwires with each wire having a first end coupled to the transistor drain terminal 305 and a second end coupled to a pad 348, corresponds with the first shunt inductance 134 in FIG. 2A. Pad 348 is a conductive pad on IPD 310 that corresponds to the RF cold point node (e.g., node 148, FIG. 1). Within IPD 310, a shunt capacitor (e.g., capacitor 142, FIG. 1) is coupled between pad 348 and a ground reference terminal (e.g., located at a bottom surface of IPD 310). Similarly, envelope inductive element 336, also shown as a set of bondwires with each wire having a first end coupled to pad 348 and a second end coupled to pad 350, corresponds with the envelope inductance 136 of FIG. 2A. Pad 350 also is a conductive pad on IPD 310. Within IPD 310, an envelope resistor (e.g., resistor 138, FIG. 1) and an envelope capacitor (e.g., capacitor 144, FIG. 1) are coupled in series between pad 350 and a ground reference terminal (e.g., located at a bottom surface of IPD 310). The first shunt inductive element 334 and the envelope inductive element 336 (i.e., the bondwires making up elements 334, 336) are physically arranged so that the signals carried by elements 334, 336 magnetically couple to achieve a virtual inductance represented as a magnetically-induced inductance 135' in FIG. 2B.

As shown in FIGS. 3A and 3B, the horizontal span of the bondwires making up inductive element 336 (i.e., the horizontal dimension between the two ends of each bondwire) is within the horizontal span of the bondwires making up inductive element 334. More specifically, pad 350 and the second ends of the bondwires making up inductive element 336 are positioned between the two ends of the bondwires making up inductive element 334 (or between the drain terminal 305 and pad 348 corresponding to the RF cold point node). In other words, the shunt path to ground from pad 348 includes a portion (i.e., bondwires 336) that extend back toward the transistor die, rather than extending toward the package output lead 315. If the bondwires 336 and the IPD 310 were re-configured so that the bondwires 336 instead extended from pad 348 toward the output lead 315, significantly less magnetic coupling would occur, during operation, between the bondwires 334, 336.

In addition, as shown in the top view of FIG. 3B, the bondwires making up inductive element 336 and the bondwires making up inductive element 334 are arranged so that the bondwires extend in parallel with each other between their ends, and the bondwires also are adjacent to and interleaved with each other (i.e., arranged in an alternating manner). For example, in the embodiment of FIG. 3B, one bondwire associated with inductive element 336 is positioned between and directly adjacent to (i.e., nothing intervening between) two bondwires associated with inductive element 334. In alternate embodiments, the number of inductive element 336 bondwires between or adjacent to inductive element 334 bondwires may be different, as long as the mutual inductance, M, between the inductive element 334, 336 bondwires is sufficient. These aspects of the relative physical arrangement of inductive elements 334 and 336 result in the non-trivial magnetic coupling (with mutual inductance M) between the inductive elements 334, 336, during operation of the device.

The first inductive element 132 (i.e., the series inductor) in FIGS. 1 and 2A is implemented using a series inductive element 332 (e.g., implemented as a set of bondwires with each wire having a first end coupled to transistor drain terminal 305 and a second end coupled to an intermediate pad 352), which is connected to the package output lead 315 via an output lead connector 320 (e.g., implemented as another set of bondwires with each wire having a first end coupled to intermediate pad 352 and a second end coupled to output lead 315). In an alternate embodiment, intermediate pad 352 may be excluded, and the first inductive element 132 may be implemented using a set of bondwires in which each wire extends directly between the drain terminal 305 and the output lead 315.

Although not to scale, the arrangement of FIGS. 3A and 3B can have the exemplary dimensions represented in FIGS. 4A and 4B, respectively, although other dimensions may be used. The wirebonds of the first shunt inductive element 334 each can have a "height" above drain terminal 305 in a range of about 5 mils to about 45 mils (e.g., about 36 mils in an embodiment) (labeled as 405), and a "span" (i.e., the horizontal separation between the transistor drain terminal 305 and pad 348) in a range of about 5 mils to about 100 mils (e.g., about 39 mils in an embodiment) (labeled as 410). The wirebonds of the envelope inductive element 336 can have a height above the surface of IPD 310 in a range of about 5 mils to about 45 mils (e.g., about 24 mils in an embodiment) (labeled as 415), and a span (i.e., the horizontal separation between pads 348 and 350) in a range of about 5 mils to about 100 mils (e.g., about 18 mils in an embodiment) (labeled as 420). The heights and spans of the bondwires of inductive elements 334, 336 may be smaller or larger, as well, as long as significant magnetic coupling occurs during operation. In an embodiment, the height of bondwires 334 is greater than the height of bondwires 336. In other embodiments, the heights of bondwires 334, 336 may be substantially equal, or the height of bondwires 336 may be greater than the height of bondwires 334. As discussed above, the span of inductive element 336 is within the span of inductive element 334, in an embodiment.

Referring in particular to the close-up top view in FIG. 4B, the separation between adjacent parallel bondwires of inductive element 334 may be in a range of about 3 mils to about 40 mils (e.g., about 12 mils) (labeled as 450), and the separation between adjacent parallel bondwires of inductive element 334 and envelope inductor 336 may be in a range of about 3 mils to about 40 mils (e.g., about 6 mils) (labeled as 455). The separation between bondwires of inductive elements 334, 336 may be smaller or larger, as well, as long as significant magnetic coupling occurs during operation. It should be understood that the dimensions provided here are only one exemplary set of dimensions, and the actual dimensions to be used are application dependent. The dimensions used in any particular application or implementation are highly correlated with operational frequency, and the parameters of the wirebonds, such as span, height and pitch, are also highly correlated with each other. The relevant operational frequency for an arrangement like the one represented in FIGS. 4A and 4B may be in a range of about 800 megahertz (MHz) to about 6 gigahertz (GHz) (e.g., around 2 GHz), in some embodiments, although the operational frequency may be outside of this example range, as well.

Figure 5B:
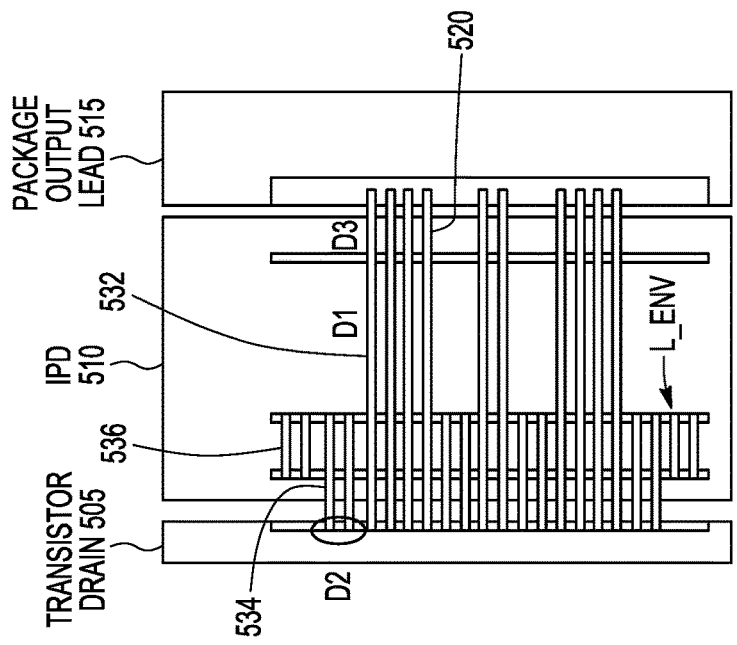
FIGS. 5A and 5B provide side and top views, respectively, of another embodiment in which a shunt inductance is achieved via magnetic coupling of inductive elements.
Figure 5A:
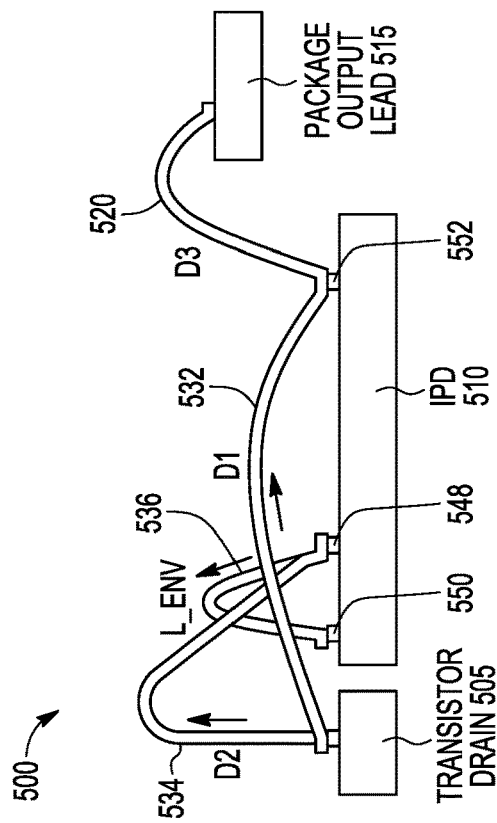

FIGS. 5A and 5B represent another embodiment of a semiconductor package for implementing the mutual coupling represented in FIGS. 2A and 2B. Package 500 includes a transistor die (including a conductive transistor drain terminal 505 coupled to a drain of transistor 120 within the transistor die), an IPD 510, and a package output lead 515, all coupled to a common substrate (e.g., a conductive flange, not shown). A first shunt inductive element 534, shown as a set of bondwires with each wire having a first end coupled to the transistor drain terminal 505 and a second end coupled to a pad 548, corresponds with the first shunt inductance 134 in FIG. 2A. Pad 548 is a conductive pad on IPD 510 that corresponds to the RF cold point node (e.g., node 148, FIG. 1). Within IPD 510, a shunt capacitor (e.g., capacitor 142, FIG. 1) is coupled between pad 548 and a ground reference terminal (e.g., located at a bottom surface of IPD 510). Similarly, envelope inductive element 536, also shown as a set of bondwires with each wire having a first end coupled to pad 548 and a second end coupled to pad 550, corresponds with the envelope inductance 136 of FIG. 2A. Pad 550 also is a conductive pad on IPD 510. Within IPD 510, an envelope resistor (e.g., resistor 138, FIG. 1) and an envelope capacitor (e.g., capacitor 144, FIG. 1) are coupled in series between pad 550 and a ground reference terminal (e.g., located at a bottom surface of IPD 510). The first shunt inductive element 534 and the envelope inductive element 536 (i.e., the bondwires making up elements 534, 536) are physically arranged so that the signals carried by elements 534, 536 magnetically couple to achieve a virtual inductance represented as a magnetically-induced inductance 135' in FIG. 2B. The first inductive element 132 (i.e., the series inductor) in FIGS. 1 and 2A is implemented using a series inductive element 532, which is connected to the package output lead 515 via intermediate pad 552 and an output lead connector 520. In an alternate embodiment, intermediate pad 552 may be excluded, and the first inductive element 132 may be implemented using a set of bondwires in which each wire extends directly between the drain terminal 505 and the output lead 515.

In the embodiment represented in FIGS. 5A and 5B, the envelope inductive element 536 is implemented as sets of bondwires on the outer edges of the IPD 510, rather than being interleaved as shown in the embodiment of FIG. 3B. The spacing between the bondwires of inductive element 536 and adjacent bondwires of inductive element 534 is selected to ensure that adequate coupling occurs between the inductive elements 534, 536, during operation. The mutual coupling between the first shunt inductive element 534 and the envelope inductive element 536 may be smaller than the mutual coupling achievable using the embodiment shown in FIGS. 3A and 3B, but nonetheless the embodiment of FIGS. 5A and 5B may provide performance enhancements in an arrangement that may be better suited, than conventional arrangements, for particular implementations and applications. As illustrated by FIGS. 3A, 3B, 5A, and 5B, the desired mutual coupling can be achieved using various different arrangements, and the configurations shown here are intended as non-limiting examples of potential arrangements.

Figure 6B:
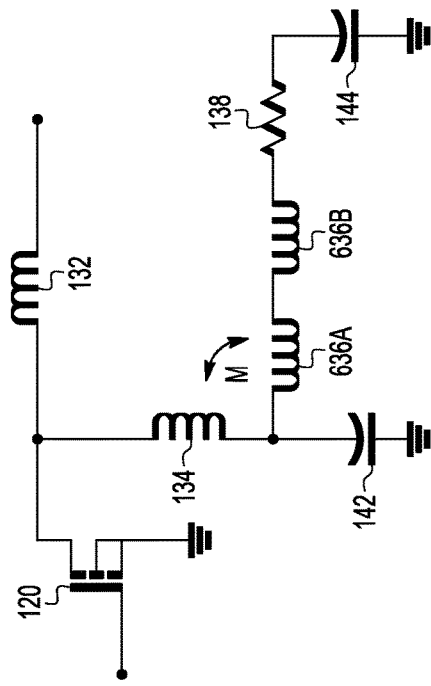
FIGS. 6A-6C provide three exemplary embodiments with alternative combinations of inductive elements.
Figure 6A:
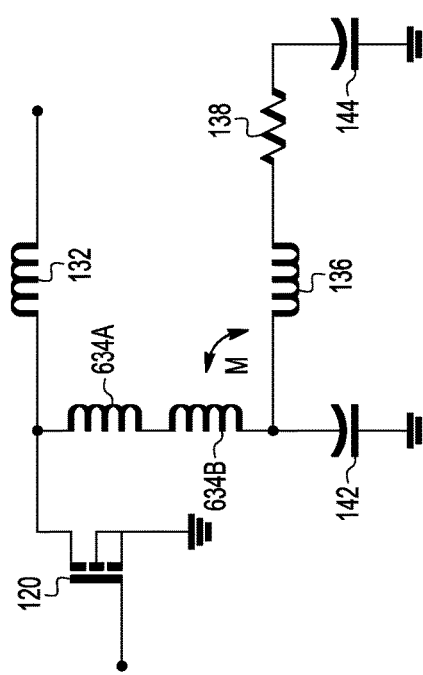
Figure 6C:
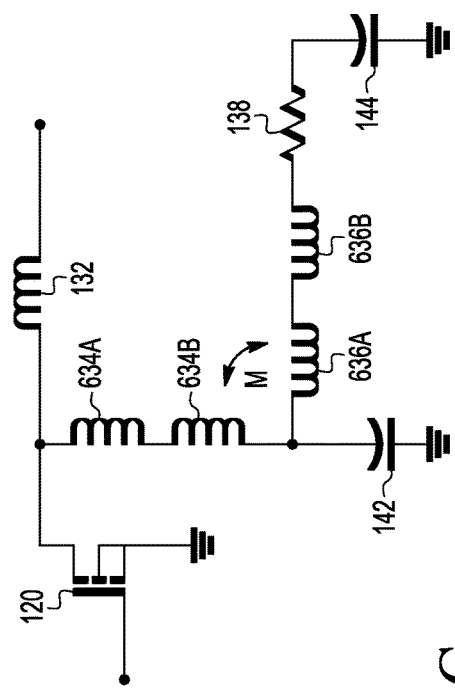

FIGS. 6A-6C provide circuit diagrams for three alternative exemplary configurations for achieving a desired inductance by mutual coupling instead of (or in addition to) by incorporation of additional components as represented in FIG. 2A. These configurations illustrate, for example, that the first shunt inductor and the envelope inductor for the baseband termination circuit can be fully or partial implemented using multiple, series coupled inductive elements (e.g., wirebonds and/or printed spiral inductors coupled in series). The mutual coupling can be implemented by the whole inductor or partial inductors, and single inductors can also be replaced by a combination of two or more inductors connected in series. For example, the shunt inductor 134 may be implemented using two shunt inductors 634A and 634B coupled in series (FIGS. 6A and 6C), and/or the envelope inductor 136 may be implemented using two envelope inductors 636A and 636B coupled in series (FIGS. 6B and 6C).

Similarly, shunt inductors 134a and 134b in FIG. 2C can be fully or partially implemented using wirebonds and/or printed spiral inductors. The mutual coupling can be implemented by the whole inductor or partial inductors, and single inductors can also be replaced by a combination of two or more inductors connected in series.

Figure 7B:
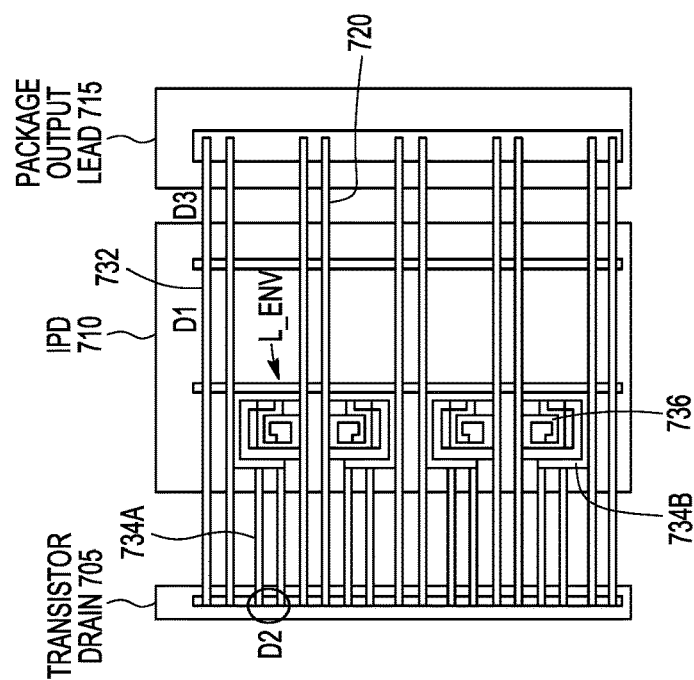
FIGS. 7A and 7B provide perspective and top views, respectively, of a packaged semiconductor implementation of the embodiment represented in FIG. 6A.
Figure 7A:
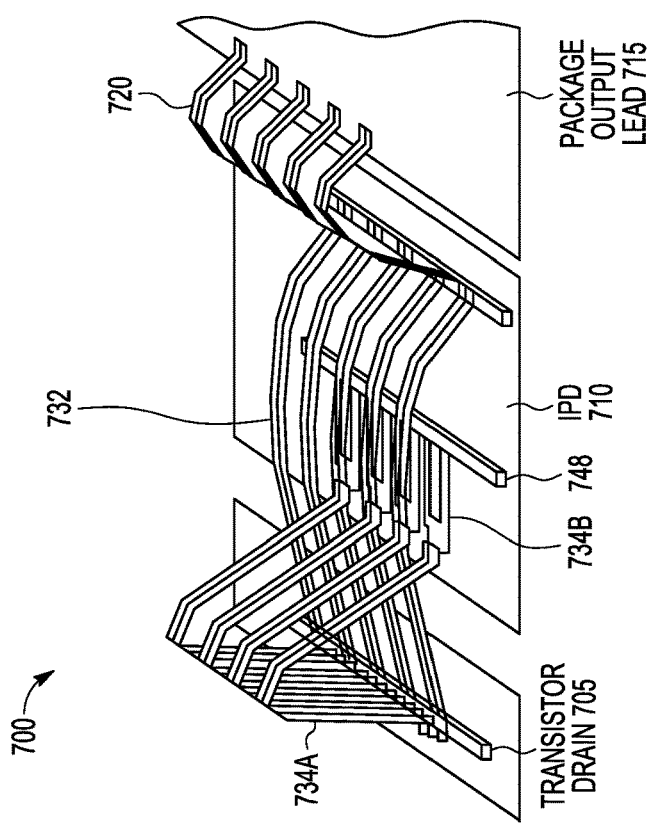

FIGS. 7A and 7B provide perspective and top views, respectively, of a subsection of an exemplary packaged device 700 corresponding with the circuit of FIG. 6A (in which shunt inductor 134 is implemented using shunt inductors 634A and 634B). The package 700 in FIGS. 7A and 7B includes includes a transistor die (including a conductive transistor drain terminal 705 coupled to a drain of transistor 120 within the transistor die), an IPD 710, and a package output lead 715, all coupled to a common substrate (e.g., a conductive flange, not shown). Instead of implementing shunt inductor 134 using a single set of bondwires (e.g., bondwires 334, 534, FIGS. 3, 5), device 700 includes a partial shunt inductor 734A in the form of a set of wirebonds, coupled in series with a partial shunt inductor 734B in the form of a spiral-on-chip (or spiral-on-IPD) inductive element. The envelope inductor 736 is similarly implemented as a spiral-on-chip (or spiral-on-IPD) inductive element instead of a set of wirebonds. More specifically, each spiral inductor 734B, 736 may be implemented using portions of one or more conductive layers within IPD 710, where the conductive portions of each inductor 734B, 736 are in close enough proximity to each other to experience magnetic coupling during operation of the device 700. According to an embodiment, a first end of each wirebond 734A is coupled to the transistor drain terminal 705, a second end of each wirebond 734A is coupled to a first end of a spiral inductor 734B in IPD 710, a second end of each spiral inductor 734B is coupled to node 748 (e.g., RF cold point node 148), a first end of each spiral inductor 736 is coupled to node 748, and a second end of each spiral inductor 736 is coupled to a ground reference terminal (e.g., located at a bottom surface of IPD 710) through an envelope resistor (e.g., resistor 138, FIG. 1) and an envelope capacitor (e.g., capacitor 144, FIG. 1) within IPD 710. The mutual coupling between spiral-on-chip partial shunt inductor 734B and spiral-on-chip envelope inductor 736 can be tuned to help improve baseband and RF performance, and reduce power dissipation in the VBW circuit.

The exemplary embodiments discussed above are well-suited for RF power transistors and amplifiers that require instantaneous signal bandwidths greater than 200 MHz, with reduced power dissipation in the VBW circuit, and high RF efficiency. This technology enables multiband transistors in discrete, integrated circuit (IC), or module configurations. Exemplary devices can be in air cavity or over-molded packages, and are applicable to both single-stage and multi-stage products, such as integrated circuits and modules. The semiconductor packages can include transistor die based on Si (silicon), GaAs (gallium arsenide), or GaN (gallium nitride).

Figure 8:
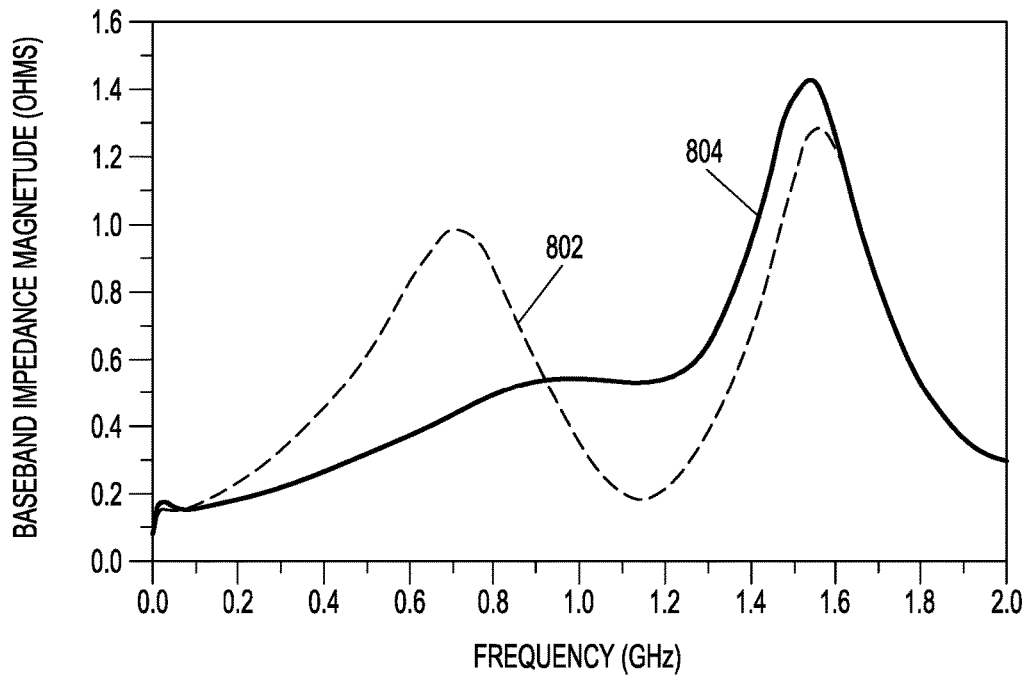
FIG. 8 is a chart comparing the magnitude of baseband impedance versus frequency for a conventional RF amplifier and an embodiment of an RF amplifier with a magnetically-induced inductance.

The use of an inductance achieved through magnetic coupling in various embodiments may achieve similar or better performance enhancements (such as a reduction in the baseband impedance up to the LFR) as is observed in devices that instead incorporate an additional, separate inductive element. To illustrate the potential improvement in baseband impedance, FIG. 8 is a chart comparing the magnitude of baseband impedance (from the transistor drain looking toward the load) versus frequency for a conventional RF amplifier and an embodiment of an RF amplifier with a modified RF cold point through inclusion of an embodiment of the inventive subject matter. In FIG. 8, the x-axis represents frequency (in GHz), and the y-axis represents the magnitude of baseband impedance, $Z_{bb}$ or $Z_{env}$ (in ohms). Trace 802 represents the magnitude of baseband impedance over frequency for a conventional RF device in which a single shunt inductor (e.g., a single set of bondwires) is coupled between the transistor drain and the shunt capacitor, and the RF cold point is the node between the shunt inductor and capacitor. As trace 802 indicates, a significant resonance may occur below the desired LFR of the device. In this case, the resonance occurs at about 700 megahertz (MHz), where the baseband impedance has a low frequency peak of about 1.0 ohm.

Conversely, trace 804 represents the magnitude of baseband impedance over frequency for an embodiment of an RF device in which the shunt inductance is divided into two inductances (e.g., first shunt inductive element $L_{shunt1}$ 134' and the second magnetically-induced inductance $L_{shunt2}$ 135', FIG. 2B), where the second inductance and the shunt capacitor form a series resonant circuit in proximity to the center operating frequency of the device. In such a configuration, with the improvement in the RF cold point, the value of the envelope inductor (e.g., $L_{env}$ 136') may be relatively low, as significantly less RF current may be present to flow through the VBW circuit and be dissipated by the envelope resistor (e.g., $R_{env}$ 138'). With the ability to have a relatively low value for the envelope inductor, trace 804 shows that the baseband impedance is significantly dampened (e.g., below 0.6 ohms) up to about 1.3 GHz. Further, with less RF current dissipation in the envelope resistor, the drain efficiency may be improved, as well.

Figure 9:
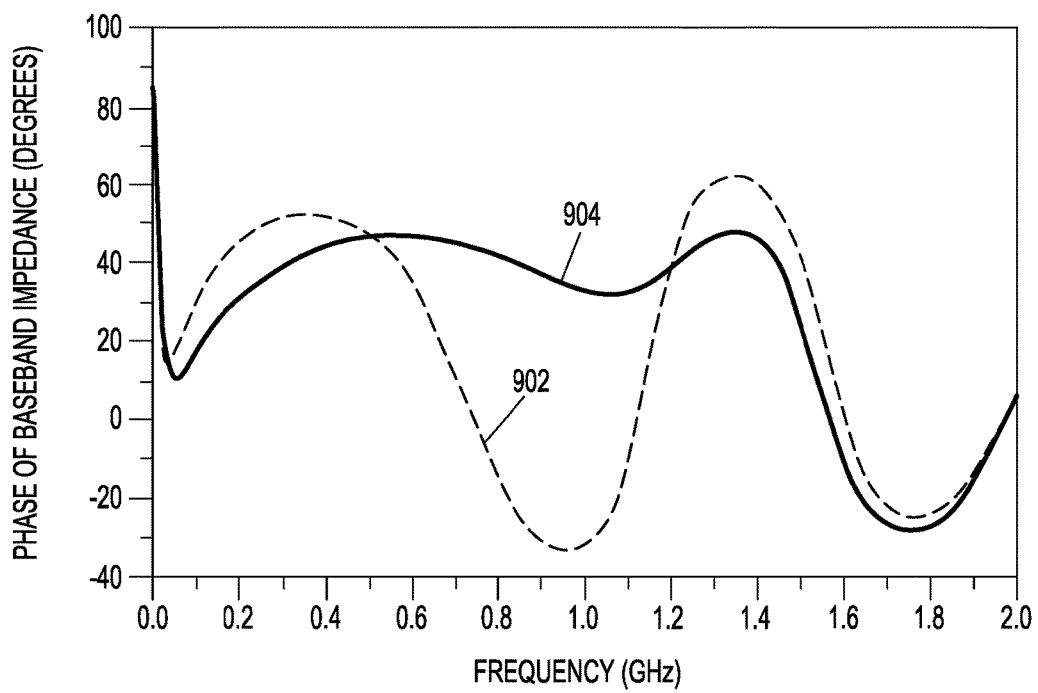
FIG. 9 is a chart comparing the phase change of baseband impedance versus frequency for a conventional RF amplifier and an embodiment of an RF amplifier with a magnetically-induced inductance.

FIG. 9 is a chart comparing the phase change of baseband impedance versus frequency for a conventional RF amplifier and an embodiment of an RF amplifier with a magnetically-induced, second shunt inductance 135'. In FIG. 9, the x-axis represents frequency (in GHz), and the y-axis represents phase of baseband impedance (in degrees). Trace 902 represents phase change over frequency for a conventional RF device in which a single shunt inductor (e.g., a single set of bondwires) is coupled between the transistor drain and the shunt capacitor, and the RF cold point is the node between the shunt inductor and capacitor.

Conversely, trace 904 represents phase change over frequency for an embodiment of an RF device in which the shunt inductance is divided into two inductances (e.g., $L_{shunt1}$ 134' and $L_{shunt2}$ 135', FIG. 2B), where the second inductance and the shunt capacitor form a series resonant circuit in proximity to the center operating frequency of the device. In such a configuration, the phase change remains relatively flat up to the LFR of the device. In other words, trace 904 indicates that the variation of the baseband impedance phase may be smaller, when compared with the variation for a conventional device (trace 902), from DC to 1.5 GHz. This also may manifest itself in significantly improved device performance.

Figure 10:
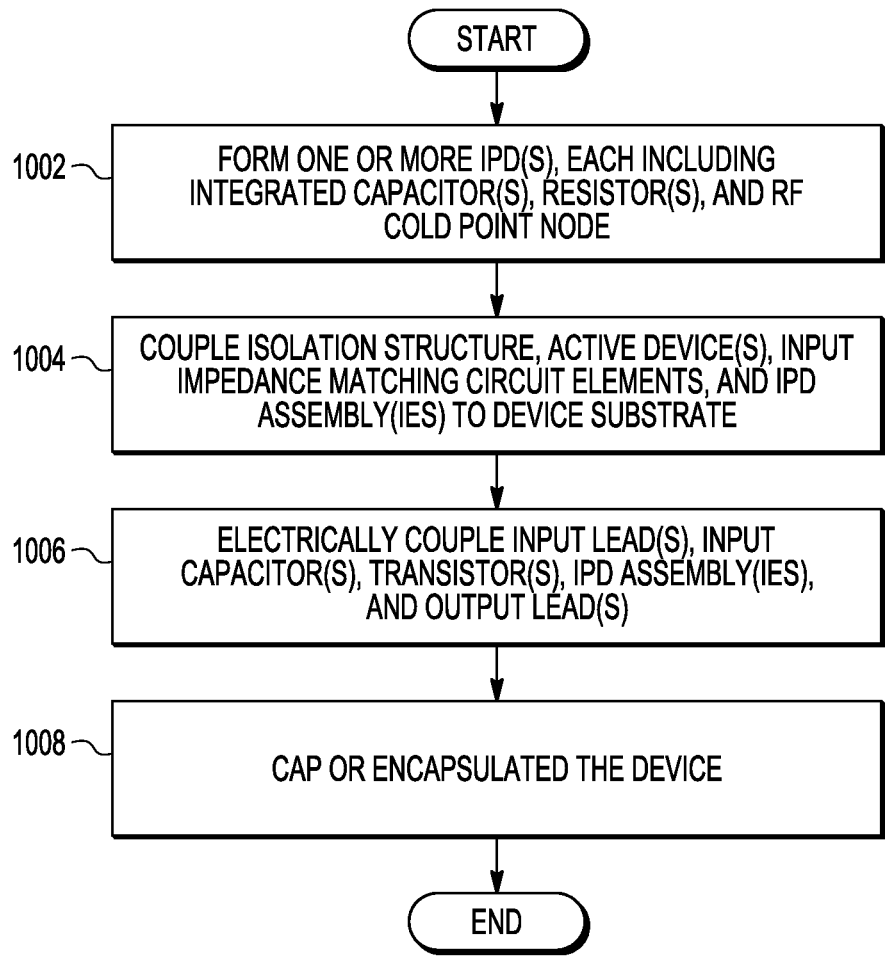
FIG. 10 is a flowchart of a method of manufacturing a packaged RF device, in accordance with an exemplary embodiment.

FIG. 10 is a flowchart of a method of manufacturing a packaged RF device (e.g., device 300, FIG. 3) with a mutually-coupled inductance to replace either or both shunt inductor or envelope inductor, in accordance with an exemplary embodiment. The method may begin, in blocks 1002-1006, by forming one or more IPDs or IPD assemblies. For example, in block 1002, one or more IPDs (e.g., IPD 310, 510, 710 in FIGS. 3, 5, 7, respectively) may be formed, each of which includes one or more integrated capacitors and one or more envelope resistors. In alternate embodiments, each IPD may exclude the low-pass matching capacitor and/or the envelope resistor(s) (e.g., the envelope resistor(s) may be implemented as discrete components later mounted to each IPD). In addition, in another embodiment, the IPD also may include one or more integrated high-capacitance, high-voltage envelope capacitors. Further, the IPD also may include integrated spiral inductors (e.g., inductors 734B, 736), in some embodiments. In addition to forming the passive components of each IPD, forming each IPD also includes forming various conductive features (e.g., conductive layers and vias), which facilitate electrical connection between the various components of each IPD assembly. Forming the IPD also includes forming an RF cold point node, which in some embodiments may be accessible at a surface of the IPD. The RF cold point node may be a conductive landing pad, for example, which may accept attachment of bondwires.

In block 1004, for an air cavity embodiment, an isolation structure is coupled to a device substrate. In addition, one or more active devices (e.g., the transistor die that includes drain terminal 305, 505, 705), input impedance matching circuit elements (e.g., capacitors), and IPD assemblies (e.g., IPDs 310, 510, 710) are coupled to a portion of the top surface of the substrate that is exposed through an opening in the isolation structure. Leads (e.g., output leads 315, 515, 715) are coupled to the top surface of the isolation structure. In an alternate embodiment, a conductive layer on the top surface of the isolation structure may be patterned and etched to form a leadframe (e.g., prior to coupling the isolation structure to the flange). For overmolded (e.g., encapsulated) device embodiments, the isolation structure may be excluded, and the substrate and leads may form portions of a leadframe.

In block 1006, the input lead(s), input capacitor(s), transistor(s), IPD(s), and output lead(s) are electrically coupled together. For example, the electrical connections may be made using bondwires between the various device components and elements, as discussed previously. For example, the first shunt inductive element (e.g., inductance 334, 534), in the form of a set of wirebonds, may be coupled between the transistor drain terminal and a shunt capacitor within the IPD. Similarly, in some embodiments, the envelope inductive element (e.g., inductance 336, 536), in the form of another set of wirebonds, may be coupled between the RF cold point node and an envelope capacitor within the IPD, with the first shunt inductive element and the envelope inductive element being physically positioned, with respect to each other, to magnetically couple during operation to generate inductance 135'. Alternatively, as discussed in conjunction with FIGS. 2C, 2D, a first shunt inductive element (e.g., inductive element 134a) and a second shunt inductive element (e.g., inductive element 134b) may be coupled in series with each other and to a shunt capacitor (e.g., capacitor 142), with the two shunt inductive elements coupling to each other magnetically to generate an envelope inductance (e.g., inductance 136ab').

Finally, in block 1008, the device is capped or encapsulated (e.g., with mold compound). The device may then be incorporated into a larger electrical system.

An embodiment of an RF amplifier includes a transistor with a control terminal and first and second current carrying terminals, and a shunt circuit coupled between the first current carrying terminal and a ground reference node. The shunt circuit includes a first shunt inductance, a mutually-coupled second shunt inductance, and a shunt capacitor coupled in series. The second shunt inductance and the shunt capacitor form a series resonant circuit in proximity to a center operating frequency of the amplifier, and an RF cold point node is present between the first and second inductances. The RF amplifier also includes a VBW circuit coupled between the RF cold point node and the ground reference node.

An embodiment of an RF amplifier includes a transistor with a control terminal and first and second current carrying terminals, and a shunt circuit coupled between the first current carrying terminal and a ground reference node. The shunt circuit includes a first shunt inductance, a second shunt inductance, and a shunt capacitor coupled in series. With the magnetic coupling between the two shunt inductors, an RF cold point node is present between the first and second inductances. The RF amplifier also includes a VBW circuit coupled between the RF cold point node and the ground reference node. The mutual inductance between the two shunt inductors may implement the envelope inductance for the VBW circuit.

An embodiment of a packaged RF amplifier device includes a device substrate, a transistor coupled to the device substrate, and a shunt circuit coupled to the device substrate. The transistor includes a control terminal and first and second current carrying terminals. The shunt circuit is coupled to the device substrate between the first current carrying terminal and a ground reference node. The shunt circuit includes a first shunt inductance, a mutually-coupled second shunt inductance, and a shunt capacitor coupled in series. The second shunt inductance and the shunt capacitor form a series resonant circuit in proximity to a center operating frequency of the RF amplifier device, and an RF cold point node is present between the first and second inductances. The device also includes a VBW circuit coupled to the device substrate between the RF cold point node and the ground reference node.

An embodiment of a packaged RF amplifier device includes a device substrate, a transistor coupled to the device substrate, and a shunt circuit coupled to the device substrate. The transistor includes a control terminal and first and second current carrying terminals. The shunt circuit is electrically coupled between the first current carrying terminal and a ground reference node. The shunt circuit includes a first shunt inductance, a second shunt inductance, and a shunt capacitor coupled in series. With the magnetic coupling between the two shunt inductors, an RF cold point node is present between the first and second inductances. The RF amplifier also includes a VBW circuit coupled between the RF cold point node and the ground reference node. The mutual inductance between the two shunt inductors implements the envelope inductance for the VBW circuit.

An embodiment of a method of manufacturing an RF amplifier device includes coupling a transistor to a device substrate, where the transistor includes a control terminal and first and second current carrying terminals. The method also includes coupling a shunt circuit to the device substrate between the first current carrying terminal and a ground reference node. The shunt circuit includes a first shunt inductance, a mutually-coupled second shunt inductance, and a shunt capacitor coupled in series. The second shunt inductance and the shunt capacitor form a series resonant circuit in proximity to a center operating frequency of the RF amplifier device, and an RF cold point node is present between the first and second inductances. The method also includes coupling a VBW circuit to the device substrate between the RF cold point node and the ground reference node.

An embodiment of a method of manufacturing an RF amplifier device includes coupling a transistor to a device substrate, where the transistor includes a control terminal and first and second current carrying terminals. The method also includes electrically coupling a shunt circuit between the first current carrying terminal and a ground reference node. The shunt circuit includes a first shunt inductance, a second shunt inductance, and a shunt capacitor coupled in series. With the magnetic coupling between the two shunt inductors, an RF cold point node is present between the first and second inductances. The RF amplifier also includes a VBW circuit coupled between the RF cold point node and the ground reference node. The mutual inductance between the two shunt inductors implements the envelope inductance for the VBW circuit.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

EXAMPLES

Illustrative examples of the technologies disclosed herein are provided below. An embodiment of the technologies may include any one or more, and any combination of, the examples described below.

In an example 1, a radio frequency (RF) amplifier comprises: a transistor with a control terminal and first and second current carrying terminals; a shunt circuit coupled between the first current carrying terminal and a ground reference node, the shunt circuit having a first shunt inductive element and a shunt capacitor coupled in series, with an RF low impedance node present between the first shunt inductive element and the shunt capacitor; and a video bandwidth circuit coupled between the RF low impedance node and the ground reference node, the video bandwidth circuit having an envelope inductive element and an envelope capacitor coupled in series; wherein the first shunt inductive element provides a first shunt inductance, and wherein the first shunt inductive element and the envelope inductive element are physically positioned, with respect to each other, to magnetically couple to produce a second shunt inductance coupled between the RF low impedance node and the shunt capacitor.

In an example 2, there is no physical inductor coupled between the RF low impedance node and the shunt capacitor for providing the magnetically-induced second shunt inductance.

In an example 3, the envelope inductive element provides an envelope inductance, and wherein an equivalent circuit model representation of the amplifier includes: an equivalent first shunt inductance coupled between the first current carrying terminal and the RF low impedance node, the equivalent first shunt inductance being substantially equal to the first shunt inductance minus the magnetically-induced second shunt inductance; and an equivalent envelope inductance coupled between the RF low impedance node and the envelope capacitor, the equivalent envelope inductance being substantially equal to the envelope inductance minus the magnetically-induced second shunt inductance.

In an example 4, the second shunt inductance and the shunt capacitor form a series resonant circuit in proximity to a center operating frequency of the amplifier.

In an example 5, the first shunt inductive element and the envelope inductive element comprise printed inductive elements.

In an example 6, the first shunt inductive element comprises a first plurality of bondwires coupled between the first current carrying terminal and the RF low impedance node, and the envelope inductive element comprises a second plurality of bondwires coupled between the RF low impedance node and a first terminal of the envelope capacitor.

In an example 7, the first and second pluralities of bondwires extend along substantially parallel axes.

In an example 8: the first shunt inductive element has an inductance value in a range of 5 picohenries to 3 nanohenries; the envelope inductive element has an inductance value in a range of 5 picohenries to 2 nanohenries; and the shunt capacitor has a capacitance value in a range of 50 picofarads to 500 picofarads.

In an example 9, the second shunt inductance has an inductance value in a range of 5 picohenries to 1 nanohenries.

In an example 10, a packaged RF amplifier device comprises: a device substrate; a transistor coupled to the device substrate, wherein the transistor includes a control terminal and first and second current carrying terminals; a shunt circuit coupled to the device substrate between the first current carrying terminal and a ground reference node, the shunt circuit having a first shunt inductive element and a shunt capacitor coupled in series, with an RF low impedance node present between the first and second shunt inductances; and a video bandwidth circuit coupled to the device substrate between the RF low impedance node and the ground reference node; wherein the first shunt inductive element provides a first shunt inductance, and wherein the first shunt inductive element and the envelope inductive element are physically positioned, with respect to each other, to magnetically couple to produce a second shunt inductance coupled between the RF low impedance node RF low impedance node and the shunt capacitor.

In an example 11, the magnetically-induced envelope inductive element provides an envelope inductance, and wherein an equivalent circuit model representation of the amplifier includes: an equivalent first shunt inductance coupled between the first current carrying terminal and the RF low impedance node, the equivalent first shunt inductance being substantially equal to the first shunt inductance minus the magnetically-induced second shunt inductance; and an equivalent envelope inductance coupled between the RF low impedance node and the envelope capacitor, the equivalent envelope inductance being substantially equal to the envelope inductance minus the magnetically-induced second shunt inductance.

An example 12 further comprises an envelope resistor coupled between the envelope inductive element and the envelope capacitor, wherein the first shunt inductive element comprises a first plurality of bondwires coupled between the first current carrying terminal and the RF low impedance node, and the envelope inductive element comprises a second plurality of bondwires coupled between the RF low impedance node and the envelope resistor.

In an example 13, the first and second pluralities of bondwires extend along substantially parallel axes.

An example 14 further comprises an envelope resistor coupled between the envelope inductive element and the envelope capacitor, wherein the first shunt inductive element comprises a first plurality of bondwires and/or a first integrated inductor coupled between the first current carrying terminal and the RF low impedance node, and the envelope inductive element comprises a second plurality of bondwires and/or a second integrated inductor coupled between the RF low impedance node and the envelope resistor.

In an example 15: the first shunt inductive element has an inductance value in a range of 5 picohenries to 3 nanohenries; the envelope inductive element has an inductance value in a range of 5 picohenries to 2 nanohenries; and the shunt capacitor has a capacitance value in a range of 50 picofarads to 500 picofarads.

In an example 16, the second shunt inductance has a value in a range of 5 picohenries to 1 nanohenries.

In an example 17, a RF amplifier comprises: a transistor with a control terminal and first and second current carrying terminals; a shunt circuit coupled between the first current carrying terminal and a ground reference node, the shunt circuit having a first shunt inductance, a second shunt inductance, and a shunt capacitor coupled in series, with an RF low impedance node present between the first and second shunt inductances; and a video bandwidth circuit coupled between the RF low impedance node and the ground reference node, the video bandwidth circuit having an envelope inductance and an envelope capacitor coupled in series; wherein the first shunt inductance is due to a first shunt inductive element, the envelope inductance is due to an envelope inductive element, and the second shunt inductance results from mutual magnetic coupling between the first shunt inductive element and the envelope inductive element without a physical inductor coupled between the RF low impedance node and the shunt capacitor.

In an example 18, an equivalent circuit model representation of the amplifier includes: an equivalent first shunt inductance coupled between the first current carrying terminal and the RF low impedance node, the equivalent first shunt inductance being substantially equal to the first shunt inductance minus the magnetically-induced second shunt inductance; and an equivalent envelope inductance coupled between the RF low impedance node and the envelope capacitor, the equivalent envelope inductance being substantially equal to the envelope inductance minus the magnetically-induced second shunt inductance.

In an example 19, the second shunt inductance and the shunt capacitor form a series resonant circuit in proximity to a center operating frequency of the amplifier.

In an example 20, the first shunt inductive element comprises a first plurality of bondwires coupled between the first current carrying terminal and the RF low impedance node, and the envelope inductor comprises a second plurality of bondwires coupled between the RF low impedance node and a first terminal of the envelope capacitor, the first and second pluralities of bondwires extending along substantially parallel axes.

In an example 21, a RF amplifier comprising: a transistor with a control terminal and first and second current carrying terminals; a shunt circuit coupled between the first current carrying terminal and a ground reference node, the shunt circuit having a first shunt inductive element, a second shunt inductive element, and a shunt capacitor coupled in series, with an RF low impedance node present between the first shunt inductive element and the second shunt inductive element; and the first shunt inductive element and the second shunt inductive element are configured to magnetically couple to induce an envelope inductive element coupled between the RF low impedance node and an envelope capacitor; and a video bandwidth circuit coupled between the RF low impedance node and the ground reference node, the video bandwidth circuit having a magnetically-induced inductive element and an envelope capacitor coupled in series.

In an example 22, there is no physical inductor coupled between the RF low impedance node and the envelope capacitor for providing the magnetically-induced envelope inductive element.

In an example 23, the magnetically-induced envelope inductive element provides an envelope inductance, and wherein an equivalent circuit model representation of the amplifier includes: an equivalent first shunt inductance coupled between the first current carrying terminal and the RF low impedance node, the equivalent first shunt inductance being substantially equal to the first shunt inductance minus the magnetically-induced envelope inductance; and an equivalent second shunt inductance coupled between the RF low impedance node and ground reference node, the equivalent second shunt inductance being substantially equal to the second shunt inductance minus the magnetically-induced envelope inductance.

In an example 24, the equivalent second shunt inductance and the shunt capacitor form a series resonant circuit in proximity to a center operating frequency of the amplifier.

In example 25, the first shunt inductive element and the second shunt inductive element comprise printed inductive elements.

In an example 26, the first shunt inductive element comprises a first plurality of bondwires coupled between the first current carrying terminal and the RF low impedance node, and the second shunt inductive element comprises a second plurality of bondwires coupled between the RF low impedance node and the ground reference node.

In an example 27, the first and second pluralities of bondwires extend along substantially parallel axes.

In an example 28: the first shunt inductive element has an inductance value in a range of 5 picohenries to 3 nanohenries; the second shunt inductive element has an inductance value in a range of 5 picohenries to 1 nanohenries; and the shunt capacitor has a capacitance value in a range of 50 picofarads to 500 picofarads.

In an example 29, the magnetically-induced envelope inductive element has an inductance value in a range of 5 picohenries to 2 nanohenries.

In an example 30, a packaged RF amplifier device comprises: a device substrate; a transistor with a control terminal and first and second current carrying terminals; a shunt circuit coupled between the first current carrying terminal and a ground reference node, the shunt circuit having a first shunt inductive element, a second shunt inductive element, and a shunt capacitor coupled in series, with an RF low impedance node present between the first shunt inductive element and the second shunt inductive element; and the first shunt inductive element and the second shunt inductive element are configured to magnetically couple to induce an envelope inductive element coupled between the RF low impedance node and an envelope capacitor; and a video bandwidth circuit coupled between the RF low impedance node and the ground reference node, the video bandwidth circuit having a magnetically-induced inductive element and an envelope capacitor coupled in series.

In an example 31, the magnetically-induced envelope inductive element provides an envelope inductance, and wherein an equivalent circuit model representation of the amplifier includes: an equivalent first shunt inductance coupled between the first current carrying terminal and the RF low impedance node, the equivalent first shunt inductance being substantially equal to the first shunt inductance minus the magnetically-induced envelope inductance; and an equivalent second shunt inductance coupled between the RF low impedance node and ground reference node, the equivalent second shunt inductance being substantially equal to the second shunt inductance minus the magnetically-induced envelope inductance.

An example 32 further comprises an envelope resistor coupled between the magnetically-induced envelope inductive element and the envelope capacitor, wherein the first shunt inductive element comprises a first plurality of bondwires coupled between the first current carrying terminal and the RF low impedance node, and the second shunt inductive element comprises a second plurality of bondwires coupled between the RF low impedance node and the ground reference node.

In an example 33, the first and second pluralities of bondwires extend along substantially parallel axes.

An example 34 further comprises an envelope resistor coupled between the magnetically-induced envelope inductive element and the envelope capacitor, wherein the first shunt inductive element comprises a first plurality of bondwires and/or a first integrated inductor coupled between the first current carrying terminal and the RF low impedance node, and the second shunt inductive element comprises a second plurality of bondwires and/or a second integrated inductor coupled between the RF low impedance node and the ground reference node.

In an example 35: the first shunt inductive element has an inductance value in a range of 5 picohenries to 3 nanohenries; the second shunt inductive element has an inductance value in a range of 5 picohenries to 1 nanohenries; and the shunt capacitor has a capacitance value in a range of 50 picofarads to 500 picofarads.

In an example 36, the second shunt inductance has a value in a range of 5 picohenries to 2 nanohenries.

In an example 37, a RF amplifier comprises: a transistor with a control terminal and first and second current carrying terminals; a shunt circuit coupled between the first current carrying terminal and a ground reference node, the shunt circuit having a first shunt inductive element, a second shunt inductive element, and a shunt capacitor coupled in series, with an RF low impedance node present between the first shunt inductive element and the second shunt inductive element; and the first shunt inductive element is due to a first shunt inductive element, and the second shunt inductive element is due to a second shunt inductive element, and the envelope inductive element results from mutual magnetic coupling between the first shunt inductive element and the second shunt inductive element without a physical inductor coupled between the RF low impedance node and an envelope capacitor; and a video bandwidth circuit coupled between the RF low impedance node and the ground reference node, the video bandwidth circuit having a magnetically-induced inductive element and an envelope capacitor coupled in series.

In an example 38, an equivalent circuit model representation of the amplifier includes: an equivalent first shunt inductance coupled between the first current carrying terminal and the RF low impedance node, the equivalent first shunt inductance being substantially equal to the first shunt inductance minus the magnetically-induced envelope inductance; and an equivalent second shunt inductance coupled between the RF low impedance node and the ground reference node, the equivalent second shunt inductance being substantially equal to the second shunt inductance minus the magnetically-induced envelope inductance.

In an example 39, the equivalent second shunt inductance and the shunt capacitor form a series resonant circuit in proximity to a center operating frequency of the amplifier.

In an example 40, the first shunt inductive element comprises a first plurality of bondwires coupled between the first current carrying terminal and the RF low impedance node, and the second shunt inductive element comprises a second plurality of bondwires coupled between the RF low impedance node and the ground reference node, the first and second pluralities of bondwires extending along substantially parallel axes.

What is claimed is:

1. A radio frequency (RF) amplifier comprising:
   a transistor with a control terminal and first and second current carrying terminals;
   a shunt circuit coupled between the first current carrying terminal and a ground reference node, the shunt circuit having a first shunt inductive element and a shunt capacitor coupled in series, with an RF low impedance node present between the first shunt inductive element and the shunt capacitor; and
   a video bandwidth circuit coupled between the RF low impedance node and the ground reference node, the video bandwidth circuit having an envelope inductive element and an envelope capacitor coupled in series; and
   wherein the first shunt inductive element provides a first shunt inductance, and wherein the first shunt inductive element and the envelope inductive element are physically positioned, with respect to each other, to magnetically couple to produce a second shunt inductance coupled between the RF low impedance node and the shunt capacitor.

2. The RF amplifier of claim 1 wherein there is no physical inductor coupled between the RF low impedance node and the shunt capacitor for providing the magnetically-induced second shunt inductance.

3. The RF amplifier of claim 1 wherein the envelope inductive element provides an envelope inductance, and wherein an equivalent circuit model representation of the amplifier includes:
   an equivalent first shunt inductance coupled between the first current carrying terminal and the RF low impedance node, the equivalent first shunt inductance being substantially equal to the first shunt inductance minus the magnetically-induced second shunt inductance; and
   an equivalent envelope inductance coupled between the RF low impedance node and the envelope capacitor, the equivalent envelope inductance being substantially equal to the envelope inductance minus the magnetically-induced second shunt inductance.

4. The RF amplifier of claim 1 wherein the second shunt inductance and the shunt capacitor form a series resonant circuit in proximity to a center operating frequency of the amplifier.

5. The RF amplifier of claim 1 wherein the first shunt inductive element and the envelope inductive element comprise printed inductive elements.

6. The RF amplifier of claim 1 wherein the first shunt inductive element comprises a first plurality of bondwires coupled between the first current carrying terminal and the RF low impedance node, and the envelope inductive element comprises a second plurality of bondwires coupled between the RF low impedance node and a first terminal of the envelope capacitor.

7. The RF amplifier of claim 6 wherein the first and second pluralities of bondwires extend along substantially parallel axes.

8. The RF amplifier of claim 7 wherein a first span of the second plurality of bondwires of the envelope inductive element is within a second the span of the first plurality of bondwires of the first shunt inductive element.

9. A packaged radio frequency (RF) amplifier device comprising:
   a device substrate;
   a transistor coupled to the device substrate, wherein the transistor includes a control terminal and first and second current carrying terminals;
   a shunt circuit coupled to the device substrate between the first current carrying terminal and a ground reference node, the shunt circuit having a first shunt inductive element, a second shunt inductive element, and a shunt capacitor coupled in series, with an RF low impedance node present between the first shunt inductive element and the second shunt inductive element;
   a video bandwidth circuit coupled to the device substrate between the RF low impedance node and the ground reference node; and wherein the first shunt inductive element provides a first shunt inductance, and wherein the first shunt inductive element and the second shunt inductive element are physically positioned, with respect to each other, to magnetically couple to produce a third shunt inductance coupled between the RF low impedance node and the ground reference node.

10. The device of claim 9 wherein the first shunt inductive element comprises a first plurality of bondwires coupled between the first current carrying terminal and the RF low impedance node, and the second shunt inductive element comprises a second plurality of bondwires.

11. The device of claim 10 wherein the first and second pluralities of bondwires extend along substantially parallel axes.

12. The device of claim 9 wherein the first shunt inductive element comprises a first integrated inductor coupled between the first current carrying terminal and the RF low impedance node, and the second shunt inductive element comprises a second integrated inductor.

13. The RF amplifier device of claim 9 wherein the third shunt inductance has a value in a range of 5 picohenries to 1 nanohenries.

14. A radio frequency (RF) amplifier comprising:
a transistor with a control terminal and first and second current carrying terminals;
a shunt circuit coupled between the first current carrying terminal and a ground reference node, the shunt circuit having a first shunt inductive element, a second shunt inductive element, and a shunt capacitor coupled in series, with an RF low impedance node present between the first shunt inductive element and the second shunt inductive element; and
a video bandwidth circuit coupled between the RF low impedance node and the ground reference node, the video bandwidth circuit having an envelope inductance and an envelope capacitor coupled in series, wherein the first shunt inductive element and the second shunt inductive element are configured to magnetically couple to induce the envelope inductance coupled between the RF low impedance node and an envelope capacitor.

15. The RF amplifier of claim 14 wherein the first shunt inductive element comprises a first plurality of bondwires coupled between the first current carrying terminal and the RF low impedance node, and the second shunt inductive element comprises a second plurality of bondwires coupled between the RF low impedance node and the ground reference node.

16. The RF amplifier of claim 15 wherein the first and second pluralities of bondwires extend along substantially parallel axes.

17. The RF amplifier of claim 14 wherein the first shunt inductive element and the second shunt inductive element comprise printed inductive elements.

18. The RF amplifier of claim 14 wherein there is no physical inductor coupled between the RF low impedance node and the envelope capacitor for providing the envelope inductance.

19. The RF amplifier of claim 14 wherein the magnetically-induced envelope inductive element provides an envelope inductance, and wherein an equivalent circuit model representation of the amplifier includes:
an equivalent first shunt inductance coupled between the first current carrying terminal and the RF low impedance node, the equivalent first shunt inductance being substantially equal to the first shunt inductance minus the magnetically-induced envelope inductance; and
an equivalent second shunt inductance coupled between the RF low impedance node and ground reference node, the equivalent second shunt inductance being substantially equal to the second shunt inductance minus the magnetically-induced envelope inductance.

20. The RF amplifier of claim 19 wherein the equivalent second shunt inductance and the shunt capacitor form a series resonant circuit in proximity to a center operating frequency of the amplifier.

* * * * *